(12) United States Patent
Lipka et al.

(10) Patent No.: US 11,128,260 B2
(45) Date of Patent: Sep. 21, 2021

(54) TRANS IMPEDANCE AMPLIFIER CAPACITANCE ISOLATION STAGE

(71) Applicant: Panasonic Intellectual Property Management Co., Ltd., Osaka (JP)

(72) Inventors: Ronald Joseph Lipka, Northborough, MA (US); Saroj Rout, Nashua, NH (US)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 203 days.

(21) Appl. No.: 16/361,675

(22) Filed: Mar. 22, 2019

(65) Prior Publication Data
US 2020/0304076 A1 Sep. 24, 2020

(51) Int. Cl.
*G01C 19/5712* (2012.01)
*H03F 3/68* (2006.01)
*H03F 3/45* (2006.01)
*H03F 1/08* (2006.01)

(52) U.S. Cl.
CPC ......... *H03F 1/086* (2013.01); *G01C 19/5712* (2013.01); *H03F 3/45188* (2013.01); *H03F 3/68* (2013.01); *H03F 2200/228* (2013.01); *H03F 2203/45374* (2013.01); *H03F 2203/45528* (2013.01); *H03F 2203/45536* (2013.01); *H03F 2203/45594* (2013.01)

(58) Field of Classification Search
CPC . H03F 1/08; H03F 1/083; H03F 1/086; H03F 1/22; H03F 1/223; H03F 1/226; H03F 1/26; H03F 2203/45374; H03F 2203/45528; H03F 2203/45594; H03F 2203/45536
See application file for complete search history.

(56) References Cited

U.S. PATENT DOCUMENTS

| | | | |
|---|---|---|---|
| 2013/0015919 A1* | 1/2013 | Kropfitsch | H03F 1/56 330/260 |
| 2017/0207760 A1* | 7/2017 | Werking | G01P 15/125 |
| 2018/0332377 A1* | 11/2018 | Polo | H03F 3/45475 |

OTHER PUBLICATIONS

International Search Report dated Jun. 9, 2020, issued in Application No. PCT/JP2020/010038 (17 pages).
Fang, Deyou et al., "A Low-Noise Low-Power Preamplifier for Capacitive CMOS-MEMS Gyroscopes", Circuits and Systems, 2006. MWSCAS '06. 49th IEEE International Midwest Symposium on, IEEE, PI, Aug. 1, 2006, pp. 270-274; Cited in ISR dated Jun. 9, 2020.

* cited by examiner

*Primary Examiner* — Herbert K Roberts
(74) *Attorney, Agent, or Firm* — Westerman, Hattori, Daniels & Adrian, LLP

(57) ABSTRACT

An electronic circuit for a micro-electro-mechanical systems gyroscope is disclosed. The electronic circuit includes a current buffer, a transimpedance amplifier coupled with the current buffer, and a plurality of transistors. An inverting input terminal of the current buffer and a non-inverting input terminal of the current buffer are connected with a plurality of first resistors. The inverting input terminal of the current buffer is connected with a source of one of the plurality of transistors, and the non-inverting input terminal of the current buffer is connected with a source of another one of the plurality of transistors. The plurality of first resistors are connected to a ground. The current buffer is configured to isolate a load in the micro-electro-mechanical systems gyroscope from the transimpedance amplifier.

9 Claims, 6 Drawing Sheets

TRANS IMPEDANCE AMPLIFIER CAPACITANCE ISOLATION STAGE

BACKGROUND

1. Field of the Invention

At least one example embodiment relates to an electronic circuit for a micro-electro-mechanical systems gyroscope, and more particularly, to an electronic circuit for a micro-electro-mechanical systems gyroscope having a current buffer followed by a transimpedance amplifier, where the current buffer isolates a load in the micro-electro-mechanical systems gyroscope from the transimpedance amplifier.

2. Description of the Related Art

The conventional electronic circuits for a micro-electro-mechanical systems (MEMS) gyroscope have a single op-amp with resistor feedback architecture (FIG. 1) and an open loop transimpedance amplifier architecture with a regulated common-gate (RCG) input (FIG. 2).

However, in the single op-amp architecture, the maximum transimpedance amplifier gain is limited by a capacitive loading of MEMS, which reduces a signal-to-noise ratio (SNR) for MEMS ASIC (application-specific integrated circuit). In addition, the single op-amp architecture consumes excessive power.

In the open loop transimpedance amplifier architecture with the regulated common-gate input, the input capacitive loading effect is minimized, but the transimpedance amplifier gain is not accurate. That is, the gain has some dependency on transistor output impedance.

Therefore, there is an urgent need to have an electronic circuit for a micro-electro-mechanical systems gyroscope for creating a very low noise, a high gain-bandwidth transimpedance amplifier with a low input and output impedance and an accurate gain.

SUMMARY

According to an aspect, there is provided an electronic circuit for a micro-electro-mechanical systems gyroscope. The electronic circuit may include a current buffer, a transimpedance amplifier coupled with the current buffer, and a plurality of transistors. An inverting input terminal of the current buffer and a non-inverting input terminal of the current buffer may be connected with a plurality of first resistors. The inverting input terminal of the current buffer may be connected with a source of one of the plurality of transistors, and the non-inverting input terminal of the current buffer may be connected with a source of another one of the plurality of transistors. The plurality of first resistors may be connected to a ground. The current buffer may be configured to isolate a load in the micro-electro-mechanical systems gyroscope from the transimpedance amplifier.

In the electronic circuit, the inverting input terminal of the current buffer and the non-inverting input terminal of the current buffer may be connected with a plurality of second resistors.

In the electronic circuit, an inverting input terminal of the transimpedance amplifier and a non-inverting input terminal of the transimpedance amplifier may be connected with a plurality of third resistors.

In the electronic circuit, an inverting input terminal of the transimpedance amplifier may be connected with a drain of one of the plurality of transistors, and a non-inverting input terminal of the transimpedance amplifier may be connected with a drain of another one of the plurality of transistors.

In the electronic circuit, a resistance value of the plurality of first resistors and a resistance value of the plurality of second resistors may be different.

In the electronic circuit, an impedance of input sides of the electronic circuit and an impedance of output sides of the electronic circuit may be different.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
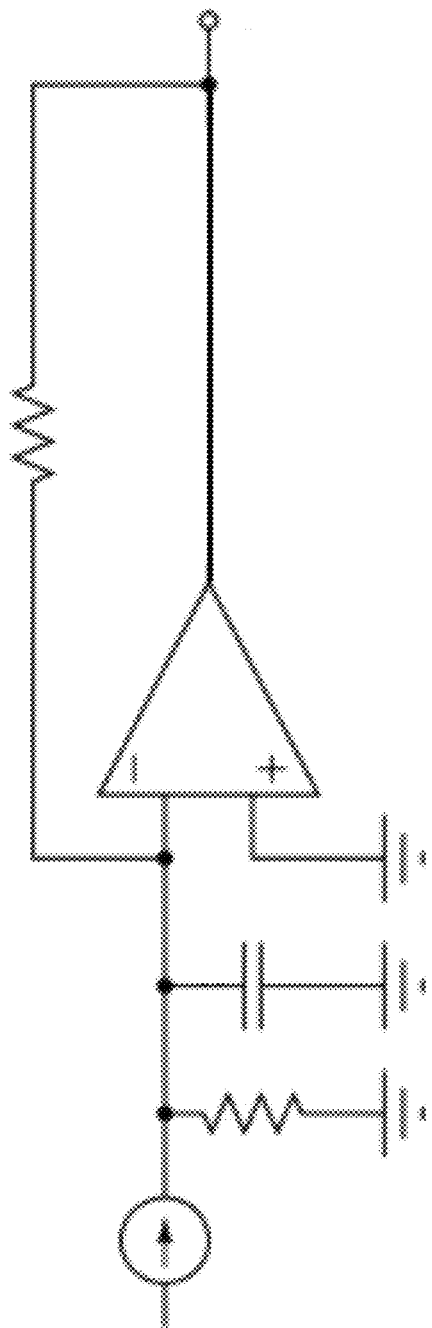
FIG. 1 is a diagram illustrating an example of a single op-amp with a resistor feedback architecture.

The following structural or functional descriptions of example embodiments described herein are merely intended for the purpose of describing the example embodiments described herein and may be implemented in various forms. Here, the example embodiments are not construed as limited to the disclosure and should be understood to include all changes, equivalents, and replacements within the technical idea of the present disclosure.

Hereinafter, example embodiments will be described in detail with reference to the accompanying drawings. Regarding the reference numerals assigned to the elements in the drawings, it should be noted that the same elements will be designated by the same reference numerals, wherever possible, even though they are shown in different drawings. Also, in the description of example embodiments, detailed description of well-known related structures or functions will be omitted when it is deemed that such description will cause ambiguous interpretation of the present disclosure.

FIG. 1 is a diagram illustrating an example of a conventional electronic circuit for a micro-electro-mechanical systems (MEMS) gyroscope having a single op-amp with resistor feedback architecture.

Figure 2:
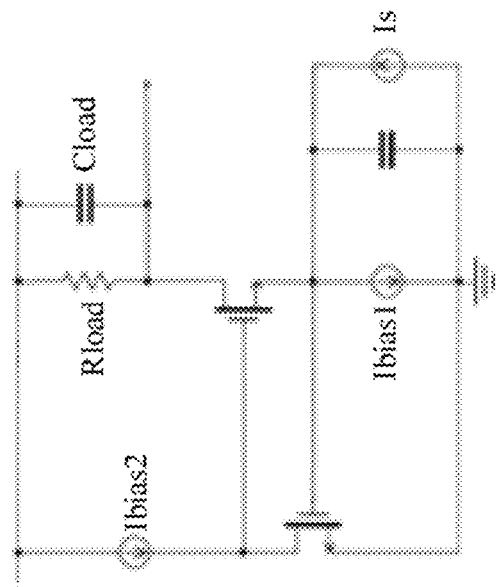
FIG. 2 is a diagram illustrating an example of an open loop transimpedance architecture with a regulated common-gate input.

FIG. 2 is a diagram illustrating an example of another conventional electronic circuit for a micro-electro-mechanical systems (MEMS) gyroscope having an open loop transimpedance amplifier architecture with a regulated common-gate (RCG) input.

However, as noted above, these conventional circuits have drawbacks. In the single op-amp architecture, the maximum transimpedance amplifier gain is limited by a capacitive loading of MEMS, which reduces the signal-to-noise ratio (SNR) for MEMS ASIC (application-specific integrated circuit). In addition, the single op-amp architecture can consume excessive power. In the open loop transimpedance amplifier architecture with the regulated common-gate input, the input capacitive loading effect is minimized, but the transimpedance amplifier gain is not accurate. That is, the gain has some dependency on transistor output impedance.

Figure 3:
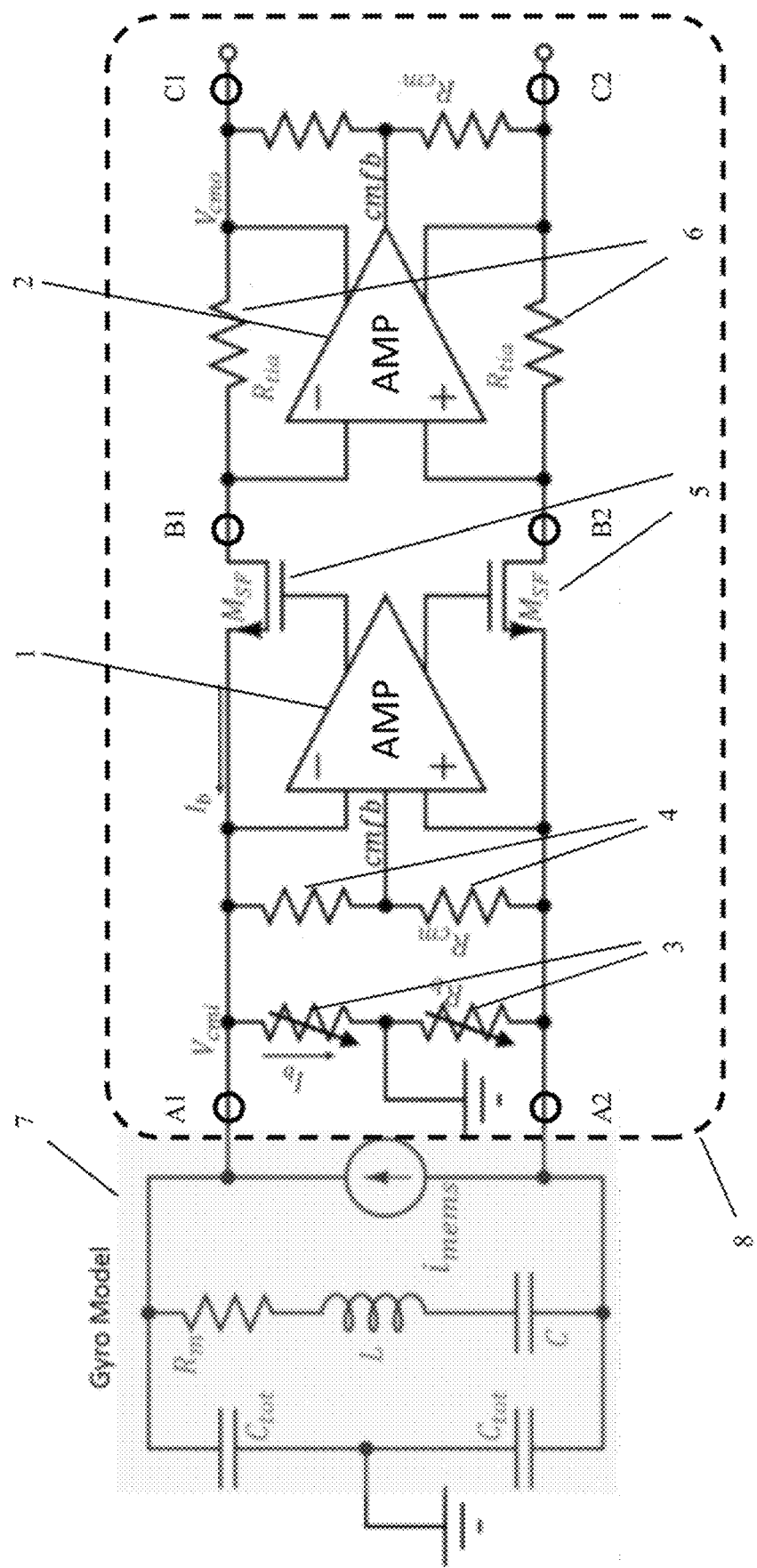
FIG. 3 is a diagram illustrating an example of an electronic circuit for a micro-electro-mechanical systems gyroscope according to an example embodiment.
Figure 4:
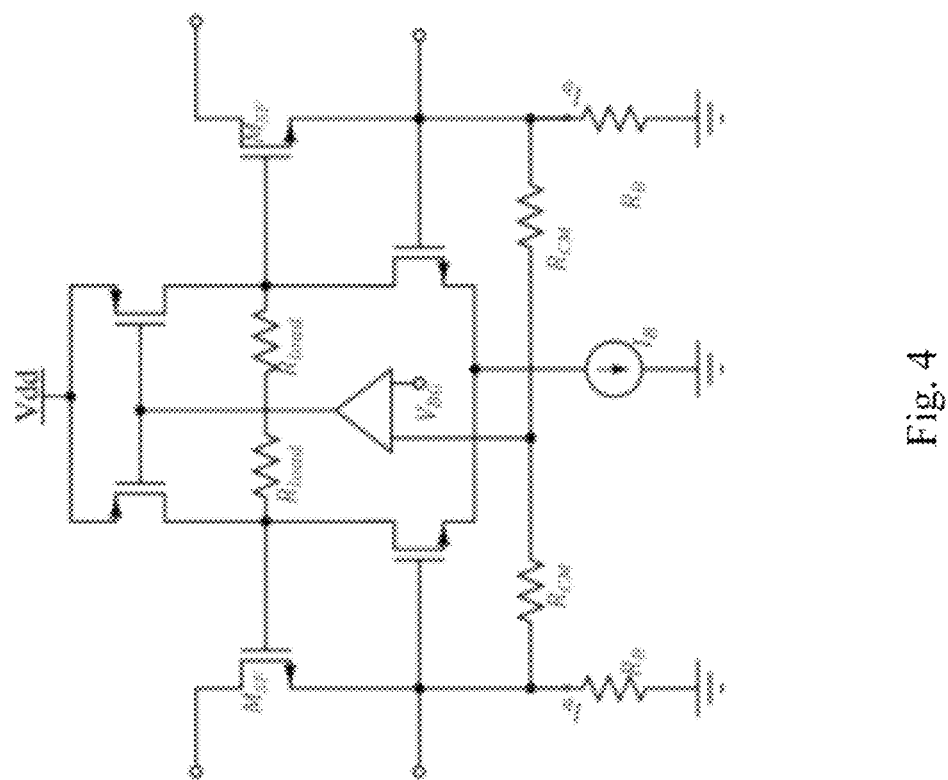
FIG. 4 is a diagram illustrating an example of a current buffer in the electronic circuit according to an example embodiment.
Figure 5:
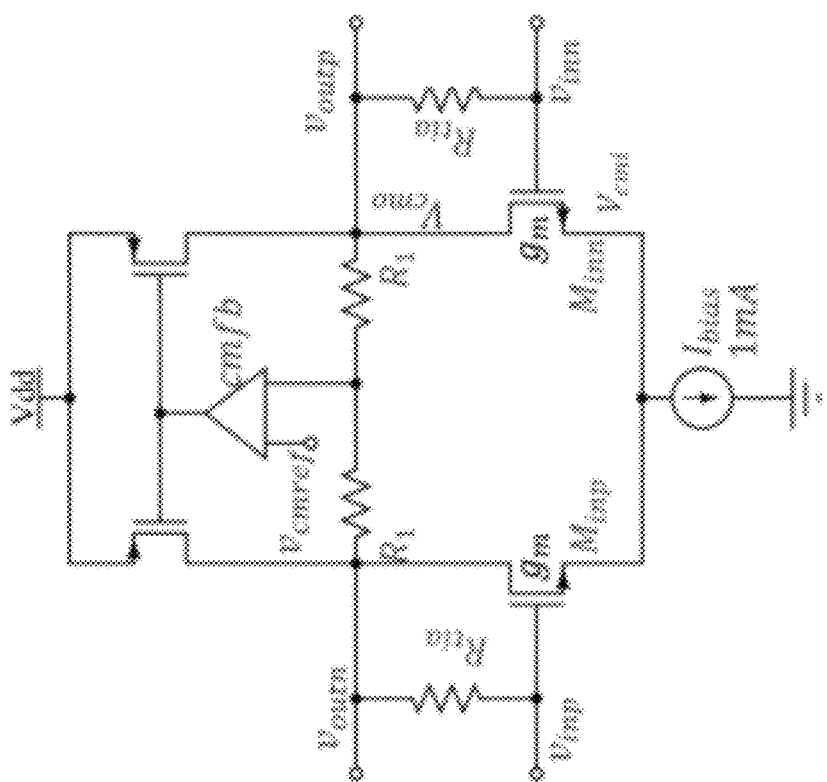
FIG. 5 is a diagram illustrating an example of a transimpedance amplifier in the electronic circuit according to an example embodiment.

FIG. 3 is a diagram illustrating an example of an electronic circuit for a micro-electro-mechanical systems gyroscope according to an example embodiment. FIG. 4 is a diagram illustrating an example of a current buffer in the electronic circuit according to an example embodiment. FIG. 5 is a diagram illustrating an example of a transimpedance amplifier in the electronic circuit according to an example embodiment.

Referring to FIG. 3, the electronic circuit 8 for the MEMS gyroscope 7 includes a current buffer 1, a transimpedance amplifier 2 coupled with the current buffer 1, and a plurality of transistors 5. An inverting input terminal of the current buffer 1 and a non-inverting input terminal of the current buffer 1 are connected with a plurality of first resistors 3. A resistance of the plurality of first resistors 3 may be 1.8 MΩ. However, this value is not just limited to 1.8 MΩ. The resistors provide quiescent bias current for transistors.

The inverting input terminal of the current buffer 1 is connected with a source of one of the plurality of transistors 5, and the non-inverting input terminal of the current buffer 1 is connected with a source of another one of the plurality of transistors 5. The plurality of first resistors 3 are connected to a ground.

The current buffer 1 isolates a load (Rm) in the micro-electro-mechanical systems gyroscope 7 from the transimpedance amplifier 2.

The inverting input terminal of the current buffer 1 and the non-inverting input terminal of the current buffer 1 may be connected with a plurality of second resistors 4. A resistance of the plurality of second resistors 4 may be 0.5 MΩ. However, this value is not just limited to 0.5 MΩ.

An inverting input terminal of the transimpedance amplifier 2 and a non-inverting input terminal of the transimpedance amplifier 2 are connected with a plurality of third resistors 6. A resistance of the plurality of third resistors 6 may be 500 kΩ. However, this value is not just limited to 500 kΩ.

An inverting input terminal of the transimpedance amplifier 2 is connected with a drain of one of the plurality of transistors 5, and a non-inverting input terminal of the transimpedance amplifier 2 is connected with a drain of another one of the plurality of transistors 5.

A resistance value of the plurality of first resistors and a resistance value of the plurality of second resistors may be different.

An impedance of input sides of the electronic circuit and an impedance of output sides of the electronic circuit may be different.

Figure 6:
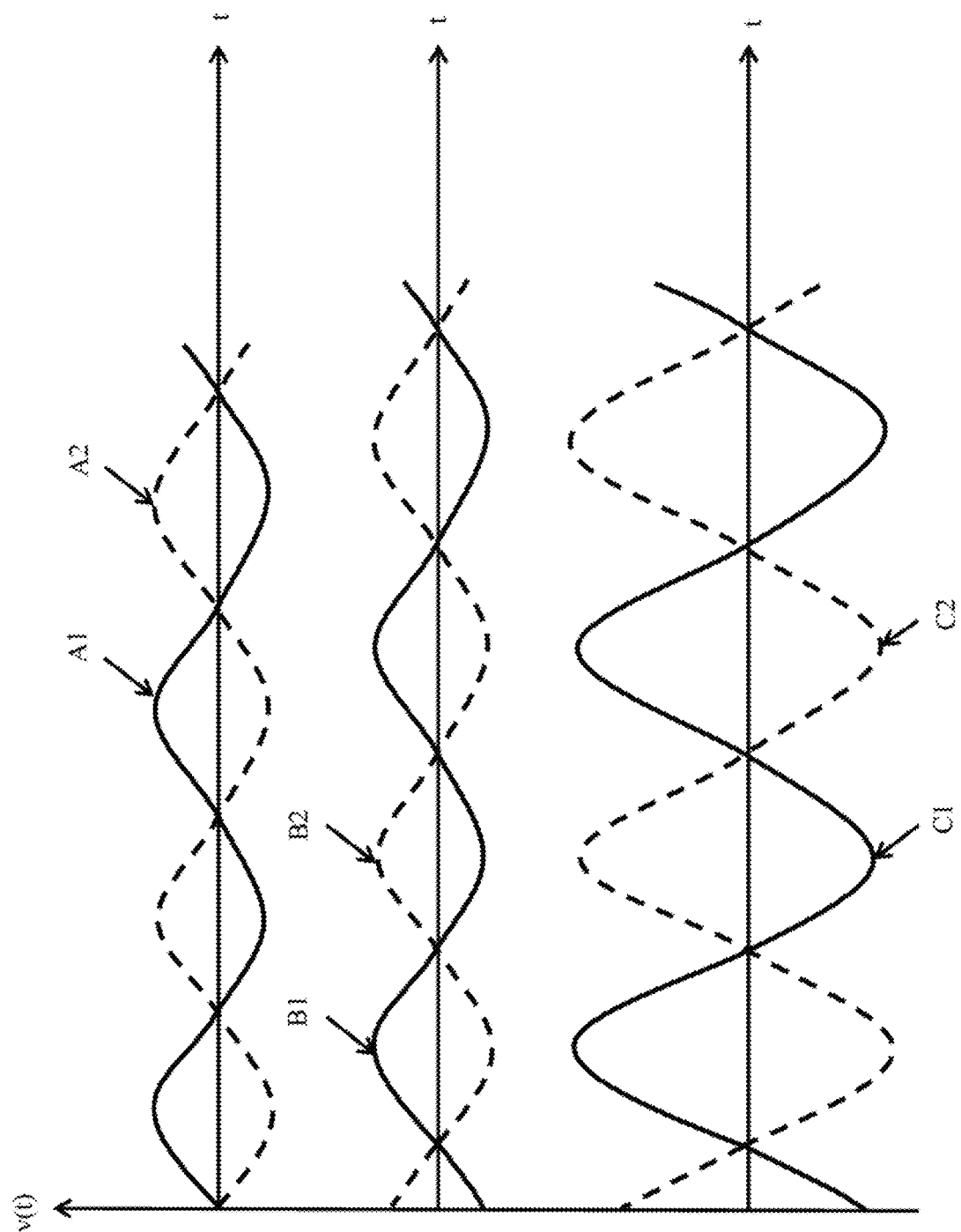
FIG. 6 illustrates examples of signal waveforms at various points (A1, A2, B1, B2, C1, and C3) in the electronic circuit for the micro-electro-mechanical systems gyroscope according to an example embodiment.

FIG. 6 illustrates examples of signal waveforms at various points (A1, A2, B1, B2, C1, and C3) in the electronic circuit for the micro-electro-mechanical systems gyroscope according to an example embodiment.

Referring to FIG. 6, signal waveforms at A1 and A2 (top) are positive and negative differential AC voltage signals. It is an input voltage to the electronic circuit 8, which has a very small value, and is almost zero. Signal waveforms at B1 and B2 (middle) are similar in amplitude to the waveforms at A1 and A2, but have a phase shift. Signal waveforms at C1 and C2 (bottom) have a much higher peak voltage level than signal waveforms at both A1/A2 and B1/B2.

Therefore, the electronic circuit 8 creates a very low noise and a high gain-bandwidth transimpedance amplifier with a low input and output impedance and an accurate gain, which would not have been possible in the conventional circuits shown in FIGS. 1 and 2.

The example embodiments described above may be implemented using a hardware component and a software component. A backend processing device may be implemented using one or more general-purpose or special purpose computers, such as, for example, a processor, a controller and an arithmetic logic unit (ALU), a digital signal processor (DSP), a microcomputer, a field-programmable gate array (FPGA), a programmable logic unit (PLU), a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements.

The software may include a computer program, a piece of code, an instruction, or some combination thereof, to independently or collectively instruct or configure the gyroscope system to operate as desired. Software and data may be embodied permanently or temporarily in any type of machine, component, physical or virtual equipment, computer storage medium or device, or in a propagated signal wave capable of providing instructions or data to or being interpreted by the device.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

EXPLANATION OF REFERENCE SYMBOLS

1: Current buffer
2: Transimpedance amplifier (TIA)
3: First resistors
4: Second resistors
5: Transistors 6: Third resistors
7: MEMS gyroscope
8: Electronic circuit

What is claimed is:

1. An electronic circuit for a micro-electro-mechanical systems gyroscope comprising:
    a current buffer;
    a transimpedance amplifier coupled with the current buffer; and
    a plurality of transistors including a first transistor and a second transistor,
    wherein an inverting input terminal of the current buffer and a non-inverting input terminal of the current buffer are connected with a plurality of first resistors;
    wherein the inverting input terminal of the current buffer is connected with a source of the first transistor, and the non-inverting input terminal of the current buffer is connected with a source of the second transistor,
    wherein an inverting input terminal of the transimpedance amplifier is connected with a drain of the first transistor, and a non-inverting input terminal of the transimpedance amplifier is connected with a drain of the second transistor,
    wherein the plurality of first resistors are connected to a ground,
    wherein the current buffer is configured to isolate a load in the micro-electro-mechanical systems gyroscope from the transimpedance amplifier.

2. The electronic circuit according to claim 1, wherein the inverting input terminal of the current buffer and the non-inverting input terminal of the current buffer are connected with a plurality of second resistors.

3. The electronic circuit according to claim 1, wherein the inverting input terminal of the transimpedance amplifier and the non-inverting input terminal of the transimpedance amplifier are connected with a plurality of second resistors.

4. The electronic circuit according to claim 2, wherein a resistance value of the plurality of first resistors and a resistance value of the plurality of second resistors are different.

5. The electronic circuit according to claim 1, wherein an impedance of input sides of the electronic circuit and an impedance of output sides of the electronic circuit is different.

6. The electronic circuit according to claim 2, wherein the inverting input terminal of the transimpedance amplifier and the non-inverting input terminal of the transimpedance amplifier are connected with a plurality of third resistors.

7. The electronic circuit according to claim 6,
    wherein the transimpedance amplifier has a first output terminal and a second output terminal,
    wherein one end of one of the plurality of third resistors is connected with the inverting input terminal of the transimpedance amplifier, and another end of the one of the plurality of third resistors is connected with the first output terminal of the transimpedance amplifier, and
    wherein one end of another one of the plurality of third resistors is connected with the non-inverting input terminal of the transimpedance amplifier, and another end of the another one of the plurality of third resistors is connected with the second output terminal of the transimpedance amplifier.

8. The electronic circuit according to claim 3,
    wherein the transimpedance amplifier has a first output terminal and a second output terminal,
    wherein one end of one of the plurality of second resistors is connected with the inverting input terminal of the transimpedance amplifier, and another end of the one of the plurality of second resistors is connected with the first output terminal of the transimpedance amplifier, and
    wherein one end of another one of the plurality of second resistors is connected with the non-inverting input terminal of the transimpedance amplifier, and another end of the another one of the plurality of second resistors is connected with the second output terminal of the transimpedance amplifier.

9. The electronic circuit according to claim 1,
    wherein the current buffer has a first output terminal and a second output terminal, and
    wherein the first output terminal of the current buffer is connected with a gate of the first transistor, and the second output terminal of the current buffer is connected with a gate of the second transistor.

* * * * *